United States Patent [19]

Wakefield

[11] 4,126,812

[45] Nov. 21, 1978

[54] SPHERICAL LIGHT EMITTING DIODE ELEMENT AND CHARACTER DISPLAY WITH INTEGRAL REFLECTOR

[75] Inventor: Gene F. Wakefield, Richardson, Tex.

[73] Assignee: Texas Instruments Incorporated, Dallas, Tex.

[21] Appl. No.: 752,389

[22] Filed: Dec. 20, 1976

[51] Int. Cl.² ............................................. G09F 9/32
[52] U.S. Cl. ..................................... 313/500; 313/499; 340/336; 357/17
[58] Field of Search ............ 340/324 M, 336; 357/17; 313/499, 500

[56] References Cited

U.S. PATENT DOCUMENTS

| | | | |
|---|---|---|---|
| 3,302,051 | 1/1967 | Galginaitis | 313/499 |
| 3,480,818 | 11/1969 | Te Velde | 313/499 |
| 3,711,789 | 1/1973 | Dierschke | 313/500 |
| 3,780,357 | 12/1973 | Haitz | 313/499 |
| 3,821,590 | 6/1974 | Kosman | 313/499 |
| 3,858,341 | 1/1975 | Wakabayashi | 340/336 |
| 3,918,052 | 11/1975 | Bricher | 340/336 |
| 4,000,437 | 12/1976 | Lederhandler | 357/17 |

*Primary Examiner*—Marshall M. Curtis
*Attorney, Agent, or Firm*—James T. Comfort; Rene' E. Grossman; James O. Dixon

[57] ABSTRACT

Light emitting p-n junction diode elements in the form of small spheres having an outer layer of semiconductor material of one conductivity type and a subsurface layer of semiconductor material of an opposite conductivity type are mounted to one surface of an insulating substrate member in holes of a proper size to allow a portion of each diode element to protrude past the other surface of the substrate; metallic coatings on one surface of the substrate provide electrical contacts to the outer layers of the spheres and metallic coatings on the other surface of the substrate provide electrical contact to the subsurface semiconductor layer of the spheres in an area where the surface layer has been removed.

10 Claims, 5 Drawing Figures

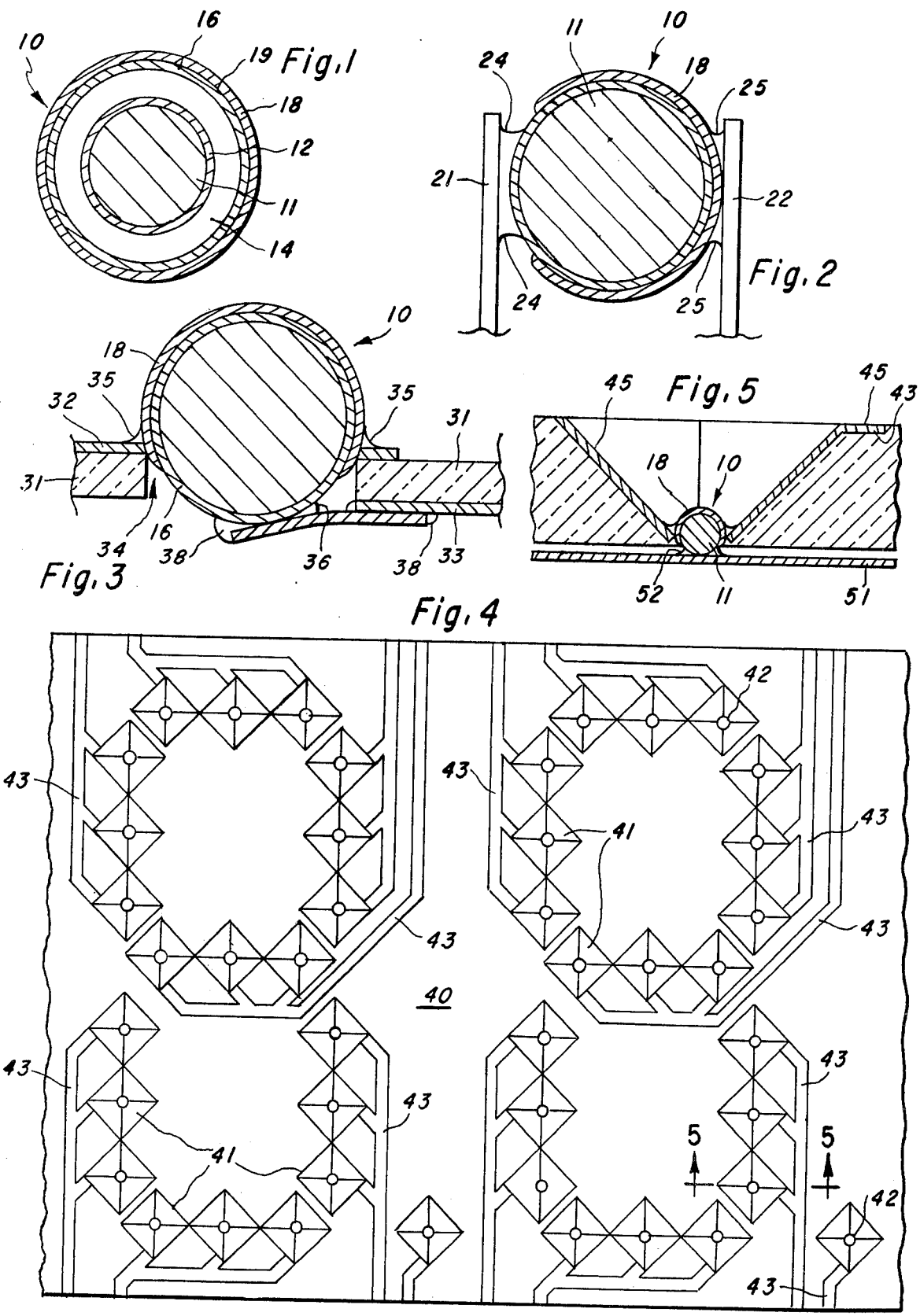

SPHERICAL LIGHT EMITTING DIODE ELEMENT AND CHARACTER DISPLAY WITH INTEGRAL REFLECTOR

This invention relates to alphanumeric character displays and more particularly to LED (Light Emitting Diode) displays and materials for constructing such displays.

It has long been known that forward biased p-n junctions in certain compound semiconductor materials will emit light. Semiconductor p-n junction diodes have been arranged in arrays to provide alphanumeric character displays. Such arrays as previously produced were relatively expensive since they involved producing the diode junction structure on a large slice of material which was thereafter cut or broken into a large number of individual diodes, thus electrically isolating them from each other, and then reassembling the diodes into arrays or arrangements to provide the characters desired. Finally individual wire connections had to be accomplished to at least one electrode of each diode. Element nonuniformity, misalignment and bad connections caused a high percentage of rework or rejection. The fact, coupled with labor intensive nature of the process involved as well as its inherently high rate of material waste, made LED displays relatively expensive to produce.

By the present invention LED alphanumeric displays can be produced much more inexpensively than by prior art techniques. According to the present invnetion small spheres of appropriate light emitting semiconductor material each having a shallow subsurface p-n junction are produced by bulk processing techniques such as by fluid bed or rotary furnace deposition. These diode spheres can then be assembled by automated equipment into arrays suitable for use in displays. For example, a thin insulating board or film with patterns of openings slightly smaller in diameter than the spheres can be used to quickly and easily position the spheres into an array and then etched circuit patterns formed on each side of the boards can be used to make contacts to and interconnections between the diode spheres of the array.

Additional cost savings can be achieved by using diode spheres which have only surface layers of expensive light-emitting material grown onto a core of much less expensive semiconductor material such as silicon or germanium.

Thus, it is one object of the present invention to provide light emitting diode arrays which can be inexpensively assembled by automated equipment.

It is a further object of the present invention to provide uniquely constructs semiconductor elements suitable for inexpensive fabrication into light-emitting diode devices.

These and other objects and advantages of the present invention will become apparent from the following detailed description when read in conjunction with the accompanying drawings in which:

FIG. 1 is a cross-sectional view of the LED diode element of the present invention;

FIG. 2 is a cross-sectional view of the diode element of FIG. 1 to which electrical contacts have been affixed;

FIG. 3 is a sectional view illustrating the mounting of the diode element of FIG. 1 in an LED display member;

FIG. 4 is a plan view of a seven-segment numerical character display using the diode element of the present invention; and FIG. 5 is a section of the display member of FIG. 4 taken along lines 5—5 of that figure.

Turning now to FIG. 1 there is shown a sectional view of the unique semiconductor element, designated generally as 10, from which the light emitting diodes and diode arrays of the present invention are made. The element 10 is made up of a core 11 of single crystal semiconductor material such as silicon or germanium. The starting small single crystal spheres or pellets of semiconductor may be produced as shown in copending application Ser. No. 437,278, filed Jan. 28, 1974 by the present applicant for "Semiconductor Particles Suitable for Use in Manufacturing Solar Cells," now U.S. Pat. No. 3,998,659. The core particle or sphere may be from one-eighth to one-half millimeter in diameter depending on the desired size of the finished diode element. Additional layers of material are added to the core 11 by vapor phase or liquid phase epitaxial processes such as that shown in the above-mentioned copending application. For example, there may be a layer 12 which is a bonding layer to achieve mechanical compatibility and expansion match between the core 11 and other layers; or layer 12 may be merely a core protection layer. Layer 12, for example, may be a layer of about 90% silicon mixed with 10% germanium over a core 11 of silicon. Of course for many material combinations, a layer corresponding to layer 12 may be unnecessary and therefore may be omitted.

Next, a crystallographic compatibility or matching layer 14 is grown on the sphere. Such a layer may be of changing composition from its inner surface to its outer surface. For example, a layer which at its inner surface is gallium arsenide to match crystallographically with a germanium core may be graded in composition to a material of 60% gallium arsenide and 40% gallium phosphide at its outer surface much in the manner of the planar layers described in U.S. patent application Ser. No. 623,283 filed Oct. 17, 1975 by William W. Gartman for "Vapor Epitaxial Method for Depositing Gallium Arsenide Phosphide on Germanium and Silicon Substrate Wafers", now U.S. Pat. No. 4,000,020. Finally, a layer 16 of constant composition, being the same composition as the outer surface of layer 14, is grown on the sphere. The layer 16 also includes minute but effective quantities of conductivity type determining impurities such as, for example, tellurium to produce n-type conductivity in gallium arsenide phosphide. Thereafter a p-type gallium arsenide phosphide impurity such as zinc is diffused into a shallow outer region 18 of the layer 16 thus producing just beneath the surface of the sphere a p-n junction 19 capable of acting as a light-emitting diode. Alternatively, layer 18 could be prepared by adding the correct impurity, such as zinc, during deposition of the layer.

Thus, the multilayered sphere of FIG. 1 forms a unique light-emitting diode element suitable for use in place of any LED elements of the prior art. It should be recognized that the materials of such a spherical diode element need not be single crystal material to be operable as a light emitter, although it has been found that single crystal material is generally preferable because of its higher efficiency of light production among other things. With this in mind it is to be recognized that the inner core of the diode elements may be of single or polycrystalline germanium or silicon or of a solid or hollow mass of glass, ceramic, metal or carbon or other suitable material.

The depiction of the diode sphere of FIG. 1 has not been shown to scale in order for the illustration to better serve its function. For example, it has been found that spheres having a finished diameter of from 0.125 to 0.5 millimeters are convenient for most uses. In diode elements of this size the outer diffused region 18 may conveniently be from about 1 to 5 microns thick; the entire layer 16 may conveniently be from about 2 to 10 microns thick and the transition layer 12 and layer 14 may conveniently be of a combined thickness of between 5 and 10 microns.

As shown in FIG. 2 the diode element 10 may be mounted between wire leads 21 and 22 of an enclosure device (not shown) for use as a discrete LED device. In such a structure a portion of the outer region 18 (anode) is removed as by abrading or etching in order that wire lead 21 may be ohmically connected as by solder 24 or otherwise to the n-type portion of layer 16. Such a solder should contain an n-type conductivity producing material such as tellurium to assure ohmic contact to the n-type region of layer 16 and rectifying contact to any p-type region 18 may accidentally contact. Lead 22 is ohmically connected to outer layer 18, such as by solder 25, containing a p-type impurity.

Another method of mounting the LED devices of the present invention is illustrated in FIG. 3. This method is especially useful in the construction of multi-element diode arrays and is well adapted for automated assembly techniques. In the assembly of FIG. 3 the support member 31 is a relatively thin insulating member such as an acetate film or a thin plate of phenolic or other circuit board type material to which have been adhered thin layers 32 and 33 of copper or other suitable conductive material. These conductive layers may be patterned, such as by etched circuit techniques or the layers may be applied as a pattern. For example, the layers may be conductive inks or paints applied by silk screen process. A pattern of holes such as 34, is cut in the support member 31 and layers 32 and 33 in the desired pattern of the diode array, the diameter of each hole being just smaller than the diameter of the diode element 10. It is then an easy matter to drop a diode element into each hole in the support 31 to form the diode array in the desired pattern. The relative sizes of the holes and diode elements are such that the diode element will just protrude to the other side of the support 31 when positioned in the hole. The diode elements 10 are held in place and the outer p-type layer 18 electrically connected to the conductive layer 32 by solder or conductive epoxy glue as shown at 35.

After the diode elements 10 are attached to the support 31 the outer anode layer 18 is removed from that portion of the diode element facing the back side of the suport such as by plasma etch or other suitable means. Electrical connection is then made between conductor 33 and cathode portion of the layer 16. This connection can be effected by a conductive strip 36 which may be soldered or glued with conductive epoxy between the two members as shown at 38. Other suitable means may be used for this connection.

FIGS. 4 and 5 illustrate a further embodiment of the present invention in the specific form of a "seven segment" numerical display which is well adapted to automated assembly.

In FIGS. 4 and 5 the base member 40 of the display is made of plastic, phenolic, or other suitable insulating material which can be formed into a relatively thin plate. Depressions 41 in the shape of inverted pyramids or cones are formed in patterns in one surface of the base plate 40. These depressions terminate at the lower surface of the base plate in small openings 42 which are of a size to support a diode element sphere 10 such that it can protrude slightly below the bottom surface of the base plate 40 as shown in FIG. 5. Recessed into the top base plate surface are passageways 43 which connect to selected groups of depressions 41. As can be seen, each group of depressions corresponds to one of the seven segments of each character of the display. The depressions 41 and passageways 43 have deposited on their surfaces a reflective and conductive coating 45. The coating 45 may be a plating of silver, copper or other suitable metal or it may be a plating of a conductive base metal with a flash of silver, nickel or other suitable material to provide high reflectivity. The area of opening 42 may have a plating of solder or tin or other low temperature melting material.

In assembly of the display, a single diode element sphere 10 is dropped into each of the depressions 41 and the entire assembly heated until the outer surface 18 of each diode element is soldered to the coating 45 in the depression it occupies. Thereafter, the bottom surface of the assembly is exposed to a vapor etch which removes the outer layer 18 of the diode element 10 from the part of the element exposed through the opening 42. Then a common connection to all of the exposed diode elements is effected such as by a metallic plate 51 which may be connected to each diode element as at 52 by low temperature solder or conductive epoxy glue.

In operation of this display the coating 45 of the depressions acts not only as an electrical contact means but as a reflector where only eight small diode elements are all that are needed to produce sufficient light for each relatively large character of this display.

Thus, there have been disclosed a unique light-emitting diode element and a light-emitting diode arraray employing such an element well suited to use as an alphanumeric character display.

While the present invention has been described with respect to illustrative embodiments, it will be apparent to those skilled in the art that various changes and modifications may be made in this invention without departing from its spirit and scope.

What is claimed is:

1. An LED array comprising an insulating support member having two major surfaces and a plurality of openings communicating between said major surfaces, a plurality of generally spherical semiconductor diode elements, said elements each having a subsurface p-n junction and being of sufficiently large diameter to prevent their passing completely through said openings, each of said diode elements being disposed partially within one of said openings from a first side of said opening, means adjacent a first one of said major surfaces of said member providing electrical connection to said diode elements on a first side of said p-n junction and means adjacent the other of said major surfaces of said member providing electrical connection to said diode elements on the other side of said p-n juncture.

2. An LED array as defined in claim 1 wherein said openings are larger at one of said major surfaces than at the other of said major surfaces.

3. An LED array as defined in claim 2 wherein said openings define conical sections.

4. An LED array as defined in claim 2 wherein said openings define pyramidal sections.

5. An LED array as defined in claim 2 wherein the walls of said openings have reflective coatings.

6. The LED array as defined in claim 3 wherein the walls of said openings have reflective coatings.

7. The LED array as defined in claim 4 wherein the walls of said openings have reflective coatings.

8. The LED array of claim 5 wherein said reflective coatings are electrically conductive and act as said means providing electrical connection to said diode element on one side of said p-n junction.

9. The LED array as defined in claim 8 wherein the openings are grouped to provide seven-segment characters.

10. The LED array as defined in claim 8 wherein said openings are grouped to provide seven-segment display characters and the elements of each group comprising a single segment are electrically connected in parallel.

* * * * *